(12) United States Patent
Lin

(10) Patent No.: US 6,358,777 B1
(45) Date of Patent: Mar. 19, 2002

(54) SPECTRALLY DETECTABLE LOW-K DIELECTRIC MARKER LAYER FOR PLASMA-ETCH OF INTEGRATED-CIRCUIT STRUCTURE

(75) Inventor: Xi-Wei Lin, Fremont, CA (US)

(73) Assignee: Philips Electronics No. America Corp., New York, NY (US)

(*) Notice: Subject to any disclaimer, the term of this patent is extended or adjusted under 35 U.S.C. 154(b) by 0 days.

(21) Appl. No.: 09/477,659

(22) Filed: Jan. 5, 2000

(51) Int. Cl.[7] .............................................. H01L 21/44
(52) U.S. Cl. ........................ 438/118; 257/758; 257/759
(58) Field of Search ................................. 438/623, 118, 438/622; 257/758, 759

(56) References Cited

U.S. PATENT DOCUMENTS 5,960,311 A * 9/1999 Singh .......................... 438/623
6,027,995 A * 2/2000 Chiang ........................ 438/623
6,114,233 A * 9/2000 Yeh ............................. 438/622

OTHER PUBLICATIONS

Dr. Campbell, the science and engineering of microelectronic fabrication– Etching, first edition, pp. 258–265.*

* cited by examiner

Primary Examiner—Olik Chaudhuri
Assistant Examiner—Nathan W. Ha
(74) Attorney, Agent, or Firm—Peter Zawilski

(57) ABSTRACT

In a dual-damascene method for forming an integrated circuit with copper conductors, a fluorinated silicon oxide (SiOF) marker layer is formed between an intermetal silicon dioxide layer and an upper silicon dioxide layer. A plasma etch forms trenches (as sited for future copper conductors) in the upper silicon dioxide layer according to a pattern defined by a photoresist mask. During this trench etch, the spectral characteristics of the plasma are monitored. After the marker layer is exposed and etching of the SiOF begins, an optical spectral detector detect is an enhancement of a spectral signal associated with fluorine ions. This detection is used in determining when to terminate the trench etch. A further photolithographic step results in via apertures. The trenches are then filled with copper. The resulting structure includes marker material in areas protected by the trench etch mask. However, because the dielectric constant of fluorinated silicon oxide (k=3.3–3.6) is lower than that of the main dielectric material, silicon dioxide (k=4), the marker material does not adversely affect the parasitic capacitance of the integrated circuit. Thus, the marker material provides for precise control of trench depth without adversely affecting device performance.

9 Claims, 3 Drawing Sheets

SPECTRALLY DETECTABLE LOW-K DIELECTRIC MARKER LAYER FOR PLASMA-ETCH OF INTEGRATED-CIRCUIT STRUCTURE

BACKGROUND OF THE INVENTION

The present invention relates to integrated circuit manufacture and, more particularly, to the formation of metal interconnect structures for integrated circuits. A major objective of the present invention is to improve trench-depth precision in a dual-damascene process often used for making copper interconnect structures.

Much of modem progress is associated with the increasing prevalence of computers, which has, in turn, been made possible by advances in integrated-circuit manufacturing technology. These advances have led to ever shrinking dimensions for circuit elements. This shrinking has made it possible to place more circuit elements on a single integrated circuit for greater functionality. In addition, the circuits are closer together so that communication among circuit elements can be faster.

A typical integrated circuit comprises a semiconductor substrate in which circuit elements are formed, a submetal structure that can include transistor gates and contacts, as well as local interconnects, a submetal dielectric, and a metal interconnect structure. The metal interconnect structure is typically formed by depositing metal (for conducting signals) and dielectric (for electrically separating conductors), and patterning the deposited materials photolithographically.

For many years, aluminum has been the metal of choice for interconnect structures since it is a good conductor, it is readily patterned, and it is process compatible with the other materials involved integrated-circuit manufacture. However, as features sizes fall to deep submicron levels, the resistance of aluminum becomes a salient factor in limiting device performance. (The resistance of a conductor is inversely proportional to its cross section, which drops with reductions in both width and thickness of a conductor. A high resistance causes high-frequency electrical energy associated with fast integrated circuits to be dissipated as heat.) To overcome this limitation, integrated circuits have turned to a lower-resistance metal—copper.

While it addresses the problem of resistance, the use of copper introduces additional problems. Copper is relatively hard to pattern; however, a damascene process has been developed to address this problem. Another problem is that copper ions have a deleterious affect if allowed to migrate into the semiconductor substrate. To address this problem, barrier metal, such as tantalum, is used to encapsulate copper conductors to prevent the migration.

The damascene process involves depositing a silicon dioxide layer, patterning that layer to form trenches, depositing a conforming layer of barrier metal, depositing copper to overfill the trenches, and polishing the copper until it is flush with the silicon dioxide. In accordance with a "dual-damascene" process, vias can be formed by masking the patterned silicon dioxide before the barrier metal is deposited and etching apertures through silicon dioxide below the trenches where the vias are to be formed. The barrier metal is then deposited so that it conforms to the via apertures as well as the trenches. The copper then fills the via apertures as well as the trenches so that a single deposition provides for both conductors and vias.

Trench depth is a critical parameter. Trench depth corresponds to the eventual conductor thickness. Excessive variation in metal thickness can cause unpredictable timing. In addition, if the trenches are too shallow via apertures from the trench down to the underlying metal can be too deep. In that case, the via apertures can have excessively high height-to-width aspect ratios; this can make it difficult for the barrier metal and copper depositions to conform properly to the underlying surfaces. As a result of poor conformity, electrical connections can be impaired. Finally, if the trenches are too deep, the underlying dielectric may be so thin that its integrity is compromised; the result can be a premature dielectric breakdown, adversely affecting device performance lifetime.

The formation of trenches in a damascene process is not the only case in which etch depth is critical. However, in many cases, the goal of an etch is to expose a material that is different from the material being etched. Where the etch is to expose a different material, there are several approaches available to control etch depth. One approach detects when the different material is exposed. Sometimes this can be done by optically monitoring the surface being etched. In the case of a plasma etch, the plasma composition changes as it begins to etch the underlying material. The etching can then be detected by monitoring the spectral characteristics of the plasma itself.

Another approach, which can be combined with detection, is to use a differential etchant technique. If the etching process etches the overlaying material much faster than the underlying material, then the etch depth is less time critical as long as the underlying material is exposed. The differential etchant approach is particular useful for chemical etching where there are a number of etchants available with very different interactions with different materials.

As feature sizes have decreased, the use of chemical etchants has been reduced in favor of plasma etches. If a plasma does not etch the underlying material much slower than the overlying material, depth control becomes problematic. One solution is to "coat" the underlying material with an etch-resistant material, which then serves as an "etch stop". For example, silicon nitride can be used as an etch stop when etching silicon dioxide over polysilicon since silicon nitride has the slowest plasma etch rate of the three.

However, the use of a silicon-nitride etch stop in the context of a dual-damascene process is not favored since the silicon nitride has a substantial higher (7.0 versus 4.0) dielectric constant than silicon dioxide. The presence of silicon nitride would thus increase capacitance. The resulting performance impairment would offset much of the advantage achieved in lowering resistance by using copper instead of aluminum.

Accordingly, the prevailing method of controlling trench depth relies on timed etches based on estimated etch rates. While timed etches can be precise for shallow etches, the trenches involved in the dual-damascene process have depths that correspond to the desired conductor thicknesses. At such depths, the precision of the timed etches is not optimal. What is needed is a method that allows for more precise trench depths and, thus, more reliable copper-based integrated circuits.

SUMMARY OF THE INVENTION

The present invention involves the use of a marker layer with a dielectric constant lower than that of silicon dioxide to indicate when an etch is to be stopped. While overlaying silicon dioxide is being etched by a plasma, the optical spectrum of the plasma is monitored for the presence of an ionic form of a constituent of the marker layer that is not silicon or oxygen or any gas used to form the bulk of the plasma. The presence of the constituent in the plasma spectrum indicates that the marker layer is being etched. The etching can be terminated as a function of the detection of this constituent.

The method of the invention involves forming a lower silicon dioxide layer over a lower patterned metal, e.g., copper, layer. The low-k dielectric marker layer is deposited on the lower silicon-dioxide layer. An upper silicon dioxide layer is deposited over the low-k marker layer. The resulting structure is masked using an upper metal layer pattern, for example by using photoresist according to conventional photolithograpy. A plasma etch is performed through the trench-pattern mask.

During the plasma etch, the optical spectrum of the plasma is monitored in such a way that etching of the marker layer can be detected. For example, the marker layer can consist of fluorinated silicon oxide (SiOF). In this case, a spectral frequency associated with fluorine ions (and not with silicon or oxygen ions) can be monitored. When the etch reaches the marker layer, the spectral component associated with fluorine ions is enhanced.

The invention provides for a variety of ways of using the detection to determine when to terminate the etch. The etch can be terminated when the spectral component is first detected. The etch can be terminated a predetermined time after the spectral component is first detected. The etch can be terminated after the spectral component disappears. In this last case, the marker material is completely removed according to the mask pattern to expose the lower silicon dioxide layer. However, the first two approaches can be used to leave a predetermined thickness of marker layer in place over the lower silicon dioxide layer. Other variations are described subsequently.

In a dual-damascene process, the resulting structure can be remasked with a via pattern. Via apertures can then be etched to expose underlying conductors. Barrier metal can be deposited conformauly over the trenches defined by the trench etch and the vias formed in the via etch. Copper is then deposited to fill the via apertures and overfill the trenches. The resulting structure is chemical-mechanically polished (CMP) until silicon dioxide outside the trenches is exposed so that the trench pattern is assumed by the copper. The resulting structure can be passivated. The process can be repeated for additional metal levels.

The resulting structure has marker material in regions that were masked during the first (trench) etch. Depending on whether the etch of the marker layer was etched partially or completely through, there may also be marker material beneath the conductors formed in the trenches (except where vias are formed). If the etch was partial, then the vias can be partially coextensive with the marker material. If the etch was completely through the marker material, then the vias may not be partially coextensive with the marker material. In either case, the conductors, at least the barrier material thereof, can be in contact with marker material.

A major advantage of the invention is that the parasitic capacitance of the complete circuit is not adversely affected by the presence of the marker material. Relative to a method employing silicon nitride as an etch stop layer, the method provides for reduced parasitic capacitance.; the reduction in capacitance, in turn, improves timing and reduces power consumption. Relative to a method relying on a timed etch for determined trench depth, the present invention provides more precise control over trench depth. This control over trench depth translates in to control over metal thickness, thus providing for more predictable timing. In addition, there is less danger of dielectric breakdown due to an intermetal dielectric that is too thin and less danger of electrical discontinuities due to high-aspect ratio via apertures. These and other features and advantages of the invention are apparent from the description below with reference to the following drawings.

DESCRIPTION OF THE PREFERRED EMBODIMENTS

Figure 1:
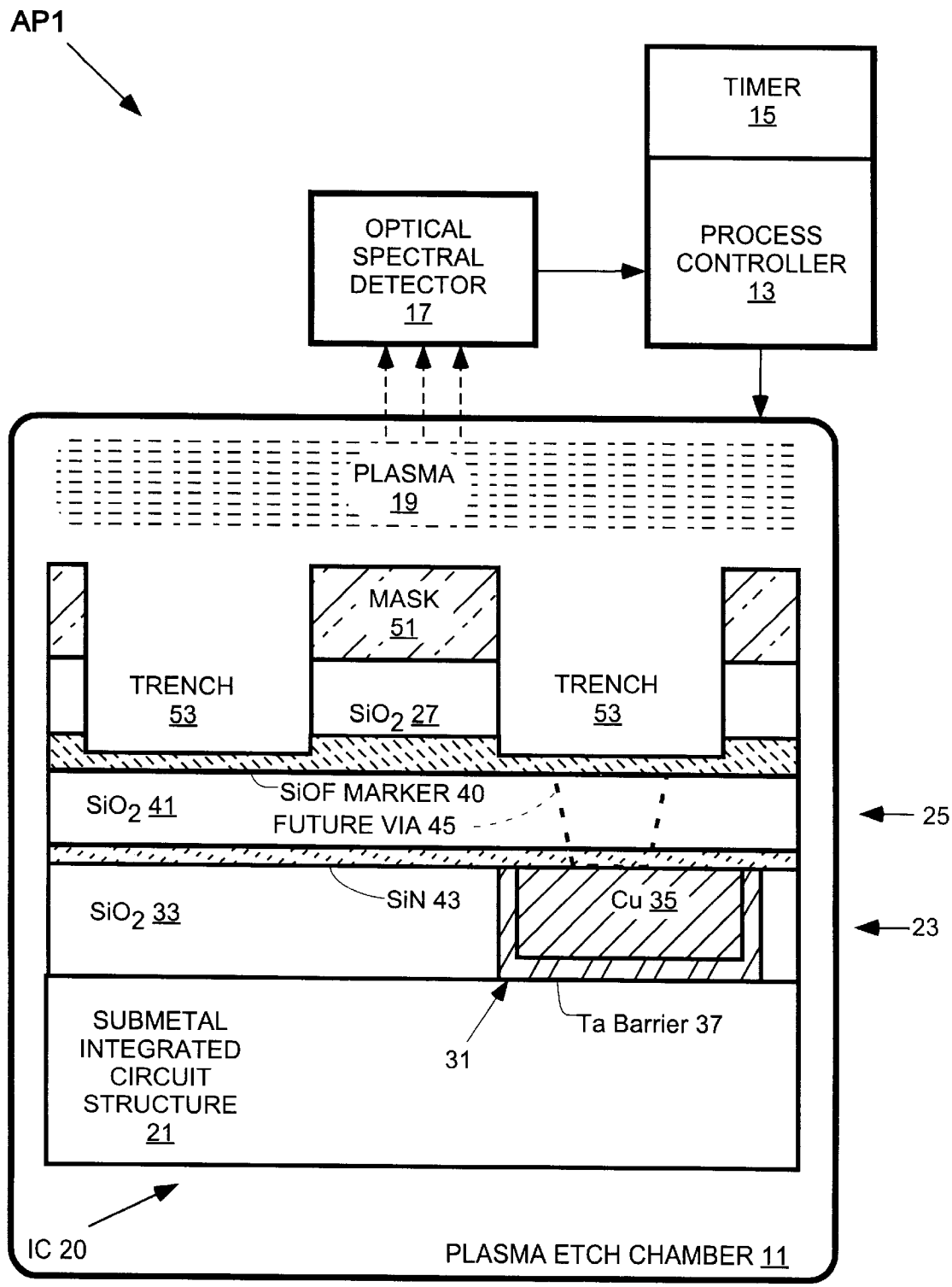
FIG. 1 is a schematic diagram of a system for fabricating an integrated circuit in accordance with the present invention.

In accordance with the present invention, a wafer processing system AP1 includes a plasma etch chamber 11, a process controller 13 including a timer 15, and an optical spectral detector 17, as shown in FIG. 1. A plasma 19 is established inside chamber 11 for etching an integrated circuit 20.

Integrated circuit 20 comprises a submetal integrated-circuit structure 21, a lower (or "first") metal layer 23, an intermetal dielectric layer 25, and an upper silicon dioxide ($SiO_2$) layer 27. Submetal structure 21 conventionally includes a semiconductor substrate with regions doped to define circuit elements, polysilicon gates and local interconnects, a planar silicon dioxide layer for insulation, and a silicon nitride (SiN) passivation layer.

Lower metal layer 23 includes a pattern of conductors 31 and a complementary pattern of silicon dioxide 33. Conductors 31 are copper (Cu) 35 with a tantalum (Ta) barrier formation 37. Intermetal dielectric layer 25 comprises a fluorinated silicon oxide (SiOF) marker layer 40, an intermetal dielectric silicon dioxide layer 41, and a silicon nitride passivation layer 43 for lower metal layer 23. Intermetal dielectric layer 25 is the site for future intermetal vias 45.

A photoresist mask 51 is disposed on upper silicon dioxide layer 27. Mask 51 defines the regions where trenches 53 are being formed in silicon dioxide layer 27. Trenches 53, in turn, define the eventual location of conductors in an upper metal layer.

Trenches 53 are formed due to the etching action of $CF_x$-based plasma on silicon dioxde 27. During the etching, the spectral characteristics of plasma 19 are monitored. Initially, the optical spectrum of the plasma includes signatures associated with the silicon and the oxygen of the silicon dioxide; the spectrum also evidences the carbon and the fluorine of the etchant.

At the point in the etching process indicated in FIG. 1, the etch has proceeded into fluorinated silicon oxide marker layer 40. The fluorine so released is ionized by the electric fields used to establish the plasma. Optical spectral detector 17 provides an indication of the strength of the fluorine signal in the plasma spectrum to process controller 13. The spectrum emitted by the excited fluorine ions from the marker layer adds to the fluorine signal due to the fluorine in the etchant. This augmentation is readily detected.

Process controller 13 has several modes of operation that address detection of marker layer 40. In a preferred mode of operation, etching continues after etching of the marker layer is detected and until the intensity of fluorine band falls below a predetermined threshold. Process controller 13 then activates timer 15 to measure a five-second interval, after which the etch is halted. The five-second interval is selected to ensure that the marker material is completely removed from the base of trenches 53.

In an alternative mode, process controller 13 activates timer 15 when the fluorine intensity first exceeds a detection threshold. The timer is set for a time sufficient to ensure complete removal of the exposed marker material. In a third mode, the processor controller sets a time sufficiently short that the etch leaves some thickness of marker material at the base of the trenches. In a fourth mode, etching is halted as soon as fluorine detection exceeds a predetermined threshold; unless the marker layer is very thin, this approach leaves some thickness of marker material at the base of the trenches.

Figure 2:
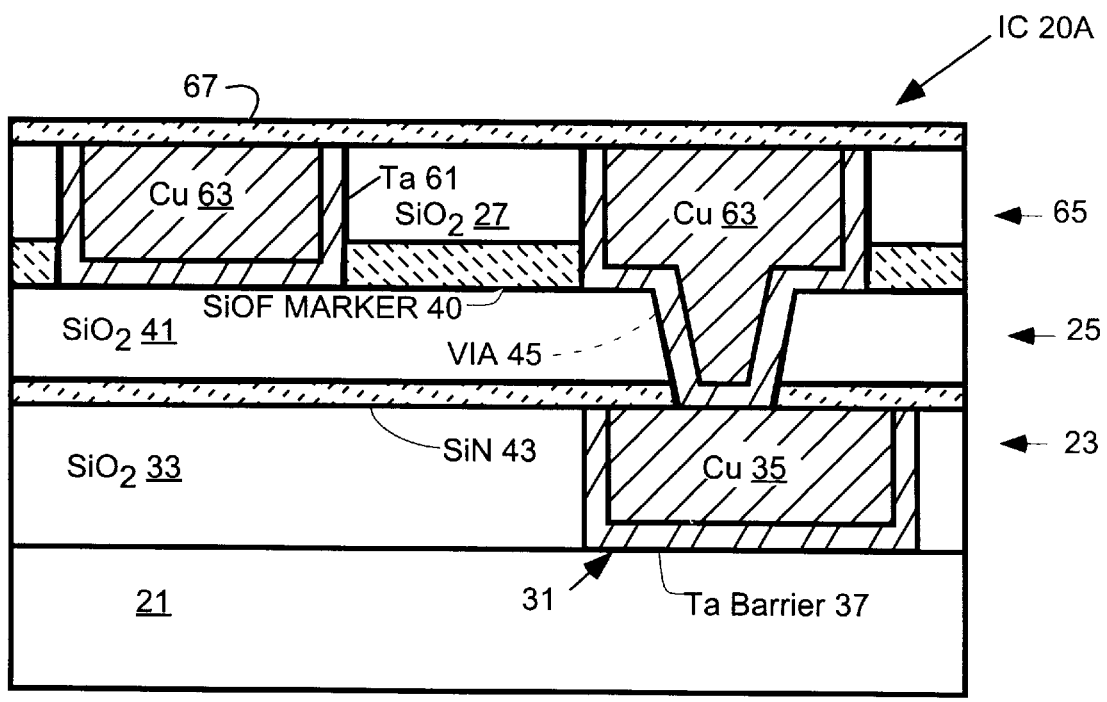
FIG. 2 is a schematic illustration of an integrated circuit fabricated in accordance with an "etch-through" variation of the method of the present invention.
Figure 3:
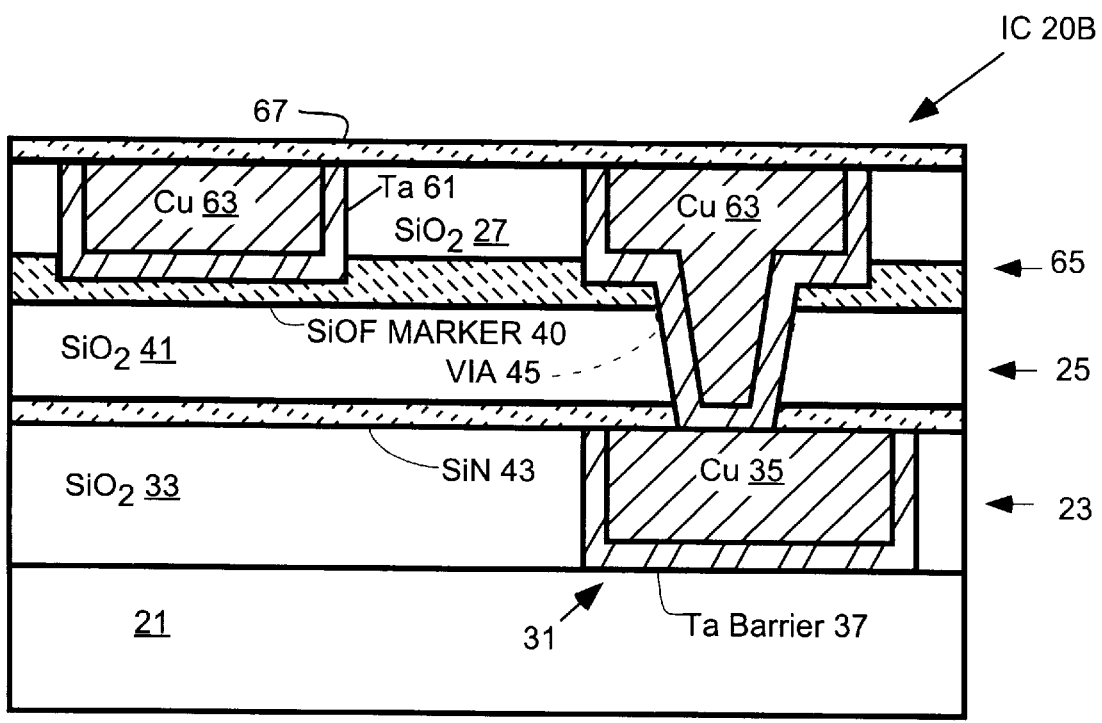
FIG. 3 is a schematic illustration of a second integrated circuit fabricated in accordance with an "etch-into" variation of the method in accordance with the present invention.

Integrated circuit 20A, shown in FIG. 2, is the result of an "etch-through" mode in which the etch proceeds entirely through marker layer 40. Integrated circuit 20B, shown in FIG. 3, is a result of an "etch-into" mode in which the etch proceeds only partially through marker layer 40. (Like components of integrated circuits 20, 20A, and 20B, are like-numbered.)

Figure 4:
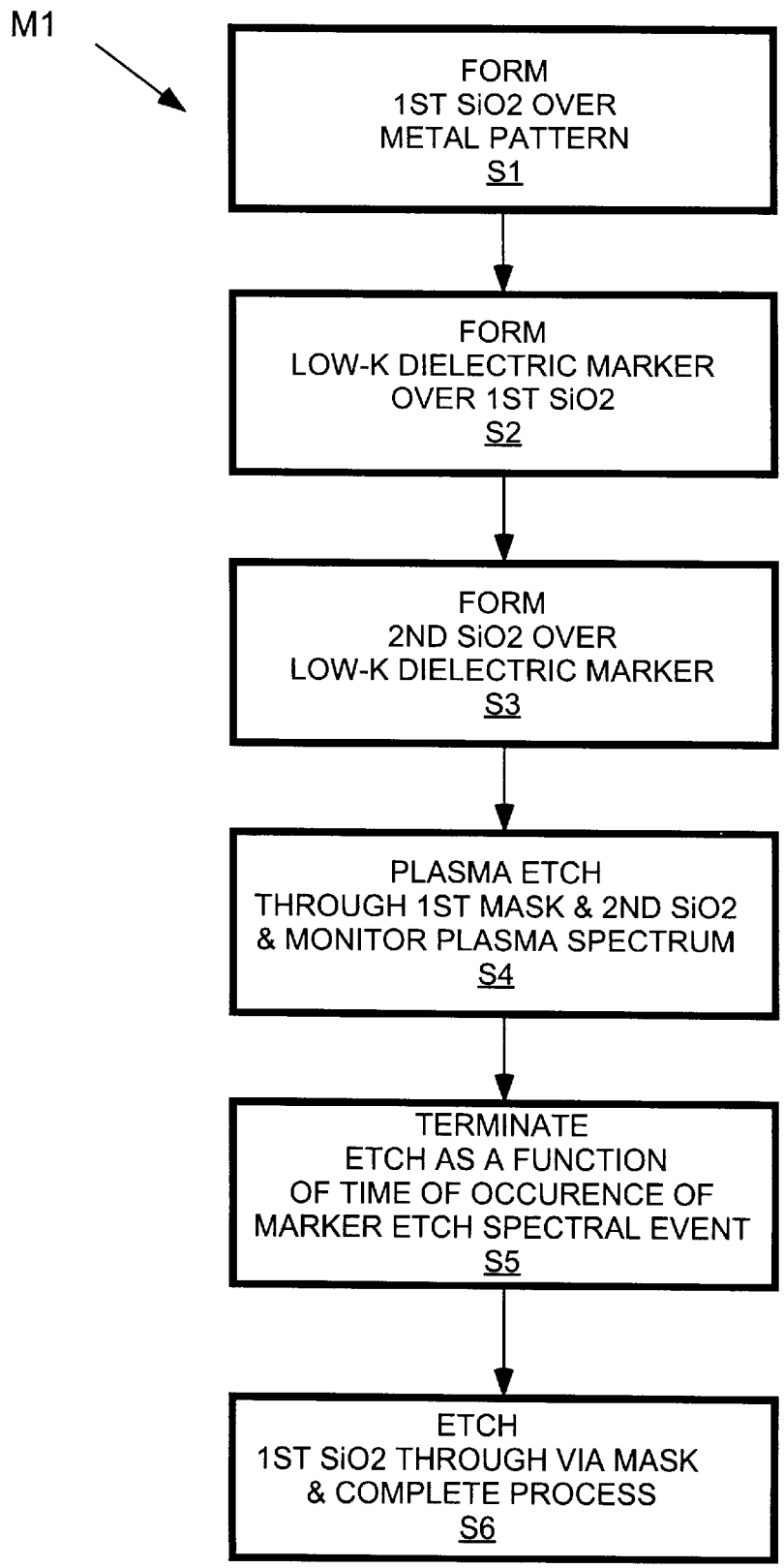
FIG. 4 is a flow chart of the method of the invention used to manufacture the integrated circuits of FIGS. 2 and 3 and employing the system of FIG. 1.

A method M1 of the invention is flow-charted in FIG. 4. Preliminary steps culminate in a chemical-mechanical polishing—leaving a planar underlayer. Step S1 involves forming a first silicon dioxide 41 layer over a planar lower metal pattern. "Over" can denote cases in which the silicon dioxide contacts the lower metal pattern, but in the illustrated embodiments, it contacts silicon nitride passivation layer 43 over lower metal layer 23. The resulting thickness should correspond generally to the desired via height. (In a conventional method, without marker material, the silicon dioxide thickness would be that of a via plus that of a conductor.)

Step S2 involves forming marker layer 40 on silicon dioxide layer 41. The dielectric constant for fluorinated silicon oxide is about 3.3–3.6, as opposed to 4 for silicon dioxide (and 7 for silicon nitride). Step S2 provides for a range of marker thicknesses. The marker layer can be as thin as one or a few atoms, and can be thick enough to function as a mechanical structural element of an integrated circuit. At the lower limit, the thickness has to be enough to allow detection. Other considerations are ensuring full coverage of the integrated circuit area and any other limits imposed by the method for applying the marker material. An advantage of a very thin marker layer is that etching can be stopped as soon as the marker is detected optically. This avoids errors that can accompany partially timed etches. However, thicker marker layers can provide for more certain detection; if the trench etch leaves a substantial thickness of marker material at the trench base, the marker material can serve to provide a lower-k dielectric than the silicon dioxide it displaces.

Step S3 involves forming an upper silicon dioxide layer over the marker material, preferably by deposition. The thickness of upper silicon dioxide layer 27 should be about equal to the desired thickness for the copper conductors to inhabit its eventual trenches.

Step S4 involves a plasma etch to form trenches 53 (FIG. 1) and monitoring the spectral characteristics of the plasma.

The plasma etch is selective in that it is prevented from attacking areas of upper silicon dioxide layer 27 masked by photoresist 51. Initially, fluorine detected by optical spectral detector 17 is solely from the etchant. However, once marker layer 40 is reached, fluorine atoms are dislodged and ionized within the electrical field that generates plasma 19. The resulting increase in the fluorine spectral signal can be detected by optical spectral detector 17—and this detection can be used to determine when to terminate the etch.

Step S5 involves terminating the trench etch as a function of the time of a detection event associated with the marker material. The event can be a detection when signal strength increases to meet a certain threshold or the event can be a detection when signal strength falls from a peak to meet a certain threshold. The termination can be immediate or delayed by a predetermined time. In the case of the formation of integrated circuit 20A, FIG. 2, the trench etch is terminated five seconds after the fluorine detection intensity falls below half of its peak level. This ensures that marker material is completely etched in areas that it is exposed. In the case of integrated circuit 20B, FIG. 3, the etch is terminated five seconds after the fluorine detection intensity first rises to a predetermined threshold. This leaves a thickness of marker material at the base of trenches 53.

Step S6 involves etching intermetal dielectric layer 25 through a via mask and completion of integrated circuit. Once the trench etch is completed, the trench mask 51 can be removed. In accordance with conventional photolithographic techniques, photoresist can be applied, exposed to a light pattern and developed, exposing trench areas where vias 45 are to be formed.

A plasma "via" etch is then performed. Any thickness of marker material is removed in the via areas. The entire thickness of intermetal-dielectric silicon dioxide is removed in the vias areas. Also, silicon nitride passivation is removed from over lower metal areas to be contacted by vias 45. Note that optical spectral detector 17 can be used to detect when copper 35 is exposed and thus when to terminate the via etch. The via-mask photoresist can be removed at this stage.

Barrier metal, such as tantalum, can then be sputtered so that it conforms to the top surface topology of the integrated circuit. The tantalum can coat the exposed lower conductor, the via aperture walls, the trench walls, and, initially, the upper surface of upper silicon dioxide layer 27. Copper is then deposited so that it fills the via apertures and overfills the trenches.

The resulting structure is chemically-mechanically polished, removing copper and tantalum that extends above the upper surface of upper silicon dioxide layer 27. This exposes the silicon dioxide outside the trench areas but leaves tantalum barrier metal 61 and copper conductors 63 and vias 45 in the trenches and via apertures. This completes formation of upper metal layer 65 comprising copper 63, tantalum barrier metal 61, and upper silicon dioxide 27. A silicon nitride layer 67 can be deposited as passivation.

The resulting structure can be represented by FIG. 2 or FIG. 3, depending on whether the trench etch of step S4 is partially or completely through marker layer 40. Also depending on this parameter, vias 45 (if the etch is completely through the marker material), the conductors 63 (if the etch is negligibly through the marker material, or both (if the etch is partially through the marker material) can laterally contact marker material in the finished integrated circuit.

The present invention provides for spectral detection of fluorine using different spectral components and different combinations of spectral components. In the illustrated embodiments, the marker material is fluorinated silicon oxide. However, the invention provides for a wide variety of marker materials that have dielectric constants k lower than that of silicon dioxide. If alternative marker materials are used, the different ionic species have correspondingly different spectral characteristics that can be detected. Alternative embodiments employ polyimides (k=3.4–3.5), fluorinated polyimides (k=2.8), hydrogen silsesquioxane (HSQ, k=3), methyl silsequioxane (MSQ, k=2.7)), organic polymers (k=2.3–2.7), parylene F (k=2.3), alpha fluorocarbon ($\alpha$-FC, k=2.2)), Aerogels and Xerogels (k=1.1–2.0).

In the case of marker materials that include atomic constituents not present in the overlaying dielectric layer (e.g., silicon and oxygen) or in the etch chemistry (e.g., carbon and fluorine), there is less background signal against which the marker signal must be detected. For example, if HSQ is used as the marker material, any hydrogen detected would be from the marker, not from the overlying dielectric or the etch chemistry. However, in practice, it is not difficult to detect an augmentation of a spectral component present in both the etch chemistry and in the marker material.

While in most cases, the invention calls for the detection of an increase of a signal component, the invention also provides for detection of a marker via a reduction in a spectral component. For example, the strength of a silicon spectral signal might be reduced as fluorinated silicon oxide replaces some of the silicon dioxide as a source of the plasma content. These and other variations upon and modifications to the present invention are provided for by the present invention, the scope of which is defined by the following claims.

What is claimed is:

1. In a method of manufacturing an integrated circuit, the steps of:

forming a lower silicon dioxide layer;

forming a low-k dielectric marker layer on said lower silicon dioxide layer, said marker layer having a dielectric constant lower than that of silicon dioxide, said marker layer having an associated spectral characteristic when ionized that allows its etching to be detected in the context of a plasma etch of an upper silicon dioxide layer;

forming said upper silicon dioxide layer on said marker layer;

forming a mask over said upper silicon dioxide layer, said mask defining a pattern;

performing said plasma etch so as to transfer said pattern into said upper silicon dioxide layer, said plasma etching including establishing a plasma;

during said plasma etching, monitoring said plasma for said spectral characteristic to detect when said marker layer is being etched;

terminating plasma etching as a function of a time when etching of said marker layer is detected during said monitoring; and patterning photolithographically the structure resulting from said terminating step so as to form an aperture through said lower silicon dioxide layer.

2. A method as recited in claim 1 wherein said plasma etching is terminated when said etching has progressed part-way through said marker layer.

3. A method as recited in claim 1 wherein said plasma etching is terminated no sooner than said etching has progressed entirely through said marker.

4. A method as recited in claim 1 wherein said marker layer includes a constituent other than silicon and other than oxygen.

5. A method as recited in claim 4 wherein said marker layer includes fluorine.

6. A method as recited in claim 5 wherein said marker layer includes fluorinated silicon oxide.

7. A method as recited in claim 1 wherein said step of performing said plasma etch so as to transfer said pattern into said upper silicon dioxide layer defines at least one trench, and said step of photolithographically patterning the structure resulting from said terminating step so as to form at least one aperture through said lower silicon dioxide layer defines at least one via aperture.

8. A method as recited in claim 7 further comprising a step of filling said trench and said via aperture with metal to define a conductor and a via.

9. A method as recited in claim 8 wherein said conductor extends above said marker layer and said via extends below said marker layer.

* * * * *